United States Patent
Hoffmann

(10) Patent No.: US 7,661,385 B2
(45) Date of Patent: Feb. 16, 2010

(54) DEVICE FOR SPIN-COATING SUBSTRATES

(75) Inventor: Dirk Hoffmann, Sipplingen (DE)

(73) Assignee: SSE Sister Semiconductor Equipment GmbH, Singen (DE)

(*) Notice: Subject to any disclaimer, the term of this patent is extended or adjusted under 35 U.S.C. 154(b) by 0 days.

(21) Appl. No.: 11/550,980

(22) Filed: Oct. 19, 2006

(65) Prior Publication Data
US 2007/0107657 A1 May 17, 2007

Related U.S. Application Data

(63) Continuation of application No. PCT/DE2005/000712, filed on Apr. 19, 2005.

(30) Foreign Application Priority Data
Apr. 20, 2004 (DE) .................. 10 2004 019 731

(51) Int. Cl.
*B05C 13/00* (2006.01)
(52) U.S. Cl. .......................... 118/52; 118/56
(58) Field of Classification Search .............. 118/52, 118/501, 56, 50, 729–733; 427/240; 156/345.55; 134/902
See application file for complete search history.

(56) References Cited

U.S. PATENT DOCUMENTS

| | | | |
|---|---|---|---|
| 4,889,069 A * | 12/1989 | Kawakami | ................... 118/50 |
| 5,611,886 A | 3/1997 | Bachman et al. | |
| 5,718,763 A | 2/1998 | Tateyama et al. | |
| 5,861,061 A | 1/1999 | Hayes et al. | |
| 5,879,457 A * | 3/1999 | Sahoda et al. | ............... 118/319 |
| 6,068,881 A | 5/2000 | Valley et al. | |
| 2001/0009135 A1 | 7/2001 | Hasbe et al. | |

FOREIGN PATENT DOCUMENTS

| | | | |
|---|---|---|---|
| JP | 59-090928 A1 | 5/1984 | |
| WO | WO 02/071154 A1 | 9/2002 | |
| WO | WO 2004/001812 | * 12/2003 | |

* cited by examiner

*Primary Examiner*—Brenda A Lamb
(74) *Attorney, Agent, or Firm*—Burr & Brown

(57) ABSTRACT

A device for spin-coating substrates with liquid media is provided, including a rotatable substrate plate for horizontally supporting a substrate, and a covering unit for covering the substrate during a distribution operation of the liquid medium by means of rotation of the substrate holder. The substrate holder is adapted to be joined tightly to the covering unit, so that passage holes arranged circumferentially on the substrate holder so that an internal coating space, defined by the covering unit and the substrate holder, is in fluid communication with the environment outside the internal space.

4 Claims, 1 Drawing Sheet

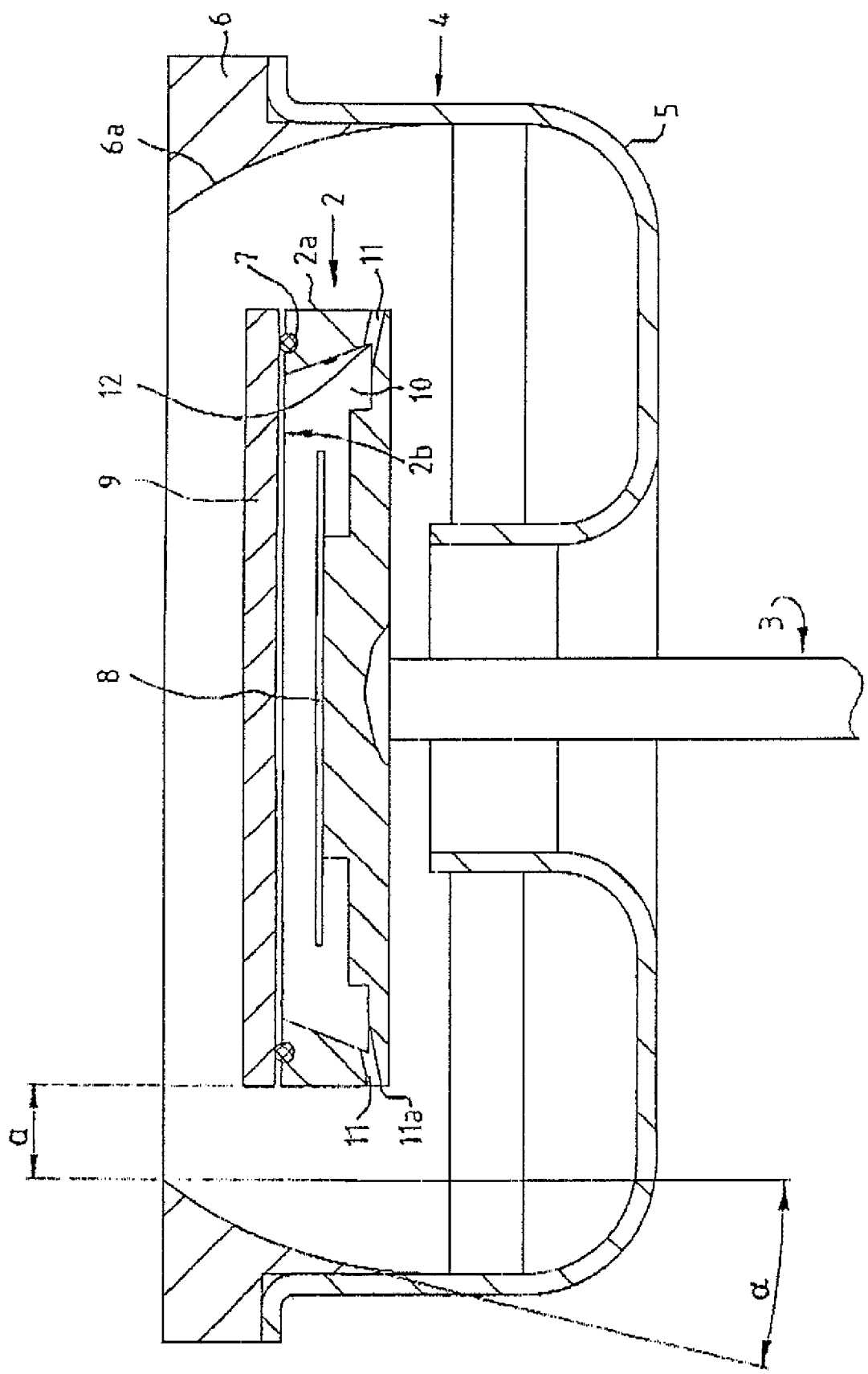

DEVICE FOR SPIN-COATING SUBSTRATES

FIELD OF THE INVENTION

The present invention relates to a device for spin-coating substrates.

BACKGROUND OF THE INVENTION

In semiconductor technology, rotary or spin-coaters, which are also called coaters, are already known in many embodiments, in particular for the application of photoresist to substrates such as wafers or glass plates, but are also used for applying other liquid media.

For reproducible production processes having a high yield, it is a decisive criterion to also be able to apply the liquid medium, such as a photoresist, in the most homogeneous layer possible, even for applications involving comparatively large substrates.

In one embodiment, a covering unit used for the "spinning process" is lowered over the substrate to be coated. By using this, the intention is to produce a solvent cushion on the substrate or the liquid medium applied, which leads to the formation of a more uniform layer during the spinning operation. Without any covering, a normally laminar flow in clean rooms would result in undesired "drying out" of the liquid medium to be applied.

SUMMARY OF THE INVENTION

An object of the present invention is to provide a spin-coating device which provides improved application of liquid media to a substrate.

The present invention relates to a device for spin-coating substrates with liquid media, and comprises a rotatable substrate holder (chuck) for horizontally supporting substrates, and a covering unit for covering the substrate during the liquid medium distribution operation by means of rotation (spinning) of the substrate holder. The crux of the present invention resides in the fact that the substrate holder can be joined tightly to the covering unit, and that circumferentially arranged passage holes are provided so that the internal coating space defined between the covering unit and substrate plate is in fluid communication (i.e., still connected) with the outside.

Accordingly, comparatively good homogeneity of a "spun-on" layer is achieved, and also, it is also possible to carry away excess media specifically at the same time by means of the passage holes.

In particular, two effects contribute to this: firstly, centrifugal forces that occur during the spinning operation distribute and displace the liquid medium radially outward into the circumferential region. The passage holes, for example drilled holes, are preferably radially arranged in order to promote the transport removal of excess spun-off medium. Furthermore, during rapid rotation of the substrate holder, a type of Venturi effect with a flow in the radial outward direction is produced in the passage holes. As a result of the rotational movement, the holes carry out a relative movement in relation to the surrounding atmosphere during the rotational movement, which means that the medium and atmosphere are sucked outwardly through the passage holes, which forms a negative pressure in the internal coating space.

The passage holes are primarily arranged in the circumferential wall region of the substrate holder, for example. The arrangement of the passage holes, for example drilled holes, is beneficially radial, and can include a predefined angle of inclination away from the horizontal, for example tilted slightly downward. In this way, the outward flowing process is further assisted.

In order to promote the formation of a negative pressure in the internal coating space, sealing means are also provided between the covering unit and the substrate holder. For example, an O-ring is arranged on a circular end wall of the substrate holder, which permits a tight connection between the substrate holder and the covering unit resting on the substrate holder.

In a particularly preferred embodiment of the present invention, a wall section is provided spaced a distance from the circumferentially arranged passage holes so that, during the spin-coating operation, the passage holes execute a movement relative to the wall section. The atmosphere between the wall section and the rotating parts of the coating device is then carried along to a lesser extent during the spinning and, in this way, the level of relative movement is increased. As a result, the "Venturi effect" in the passage holes is intensified, which leads to an increased extraction effect. This is desired to a predefined extent, because, as a result, excess medium is virtually completely extracted via the passage holes. In addition, this measure has a positive influence on the homogeneity of the applied layer.

Moreover, the carrying along of the atmosphere in the region around the rotating parts (substrate holder, covering unit) over the wall section is reduced since the atmosphere "rubs" on the wall section.

In particular, with regard to the Venturi effect, the extraction effect is determined by the passage holes and/or the formation of the wall section and/or the manner in which the passage holes are related to the wall section.

In order to obtain the desired flow in the passage holes, the spacing of the passage holes from the wall section as well as the shape of the wall section and therefore the orientation of a wall section surface play an influential role. In a preferred embodiment, the largely rotationally symmetrical substrate holder is arranged so that it can rotate in a rotationally symmetrical trough unit which has a rotationally symmetrical, conical shell-like wall section, that can also have a curved surface over the shell height in the region of the passage holes. The wall section preferably has a predefined spacing with a predetermined angle of inclination in the region of the passage holes, and it is particularly preferred that the shell section is widened toward the bottom.

For coating with photoresist, for example, the distance should preferably be set so that an adequate extraction effect occurs in the passage holes and also so that the extracted medium does not interact with the surrounding wall section to cause thread formation between the rotating parts and the wall section.

The rotational speed of substrate holder with the covering unit can be in a range of a few revolutions per minute to several hundreds of revolutions per minute. In this case, in addition to the geometric conditions, the rotational speed has a great influence on the extraction effect in the passage holes.

BRIEF DESCRIPTION OF THE DRAWING

An exemplary embodiment of the present invention is illustrated in the drawing FIGURE, which shows a schematic sectional view of a "spin-coater" with a substrate to be coated.

DETAILED DESCRIPTION OF THE INVENTION

The spin-coater 1 comprises a rotatable substrate plate 2 having a rotary shaft 3, which is arranged concentrically in an annular collecting trough 4. The collecting trough 4 comprises an annular base part 5, which can be equipped with extraction means (not illustrated), and a rotationally symmetrical attachment 6 which, over its height, defines a slightly curved conical shell-like inner wall section 6a which points toward the substrate plate 2. The curve can follow any designed curve. The substrate plate 2 has a circumferential wall 2a, into whose annular end wall an O ring 7 is inserted.

During the spinning operation following the application of a medium to be coated on a substrate 8, a covering element 9 is put in place, which closes the opening 2b of the substrate plate 2 tightly via the O-ring 7. However, the internal coating space 10 produced as a result is not then hermetically sealed with respect to the outside, but is connected to the atmosphere of the collecting trough 4 via passage holes 11. The passage holes are preferably configured as drilled passage holes whose longitudinal axis runs radially. A plurality of drilled passage holes 11 are, for example, distributed uniformly over the circumference of the circumferential wall 2a of the substrate plate 2 in the lower region of the latter. A rotationally symmetrical arrangement is preferred with respect to providing homogeneity of the layer to be produced. The passage holes 11 are tilted slightly downwardly in order to promote an extraction effect of excess medium. The outward flow process is also promoted by the fact that the passage holes 11 begin in a lower, radially outer corner 12 of the internal coating space 10.

The distance a between the circumferential wall 2a of the substrate holder and the wall section 6a of the attachment 6 is preferably less than 20 mm-30 mm, and is in particular 10 mm. Furthermore, the angle of inclination of the wall section 6a has an influence on the extraction behavior through the passage holes 11. In the present case, this is $\alpha=20°$. The angle of inclination determines the distance from the wall section 6a to the outlets 11a of the passage holes 11, which has an influence on the behavior of the atmosphere between the outlets 11a of the passage holes 11 and the wall section region in a region located radially opposite in one plane. This, in turn, has an effect on the extraction behavior in the passage holes 11.

During the spinning operation with the covering element 9 closed, flow is built up in the passage holes 11, which draws excess material off to the outside in a substantially completely manner and in addition, produces a negative pressure in the internal coating space 10. In this way, the application of a homogeneous layer onto the substrate 8 is promoted.

LIST OF REFERENCE SYMBOLS

1 Spin-coater
2 Substrate plate
2a Circumferential wall
2b Opening
3 Rotary shaft
4 Collecting trough
5 Base part
6 Attachment
6a Wall section
7 O ring
8 Substrate
9 Covering element
10 Internal coating space
11 Passage holes
11 Outlet
12 Corner

The invention claimed is:

1. A device for spin-coating substrates with liquid media, comprising:
a rotatable substrate holder, for horizontally supporting a substrate, rotatably arranged in an annular trough unit;
a covering unit for covering the substrate during a distribution operation of the liquid media as the substrate holder rotates; and
an attachment, provided on the annular trough unit, substantially surrounding the substrate holder;
wherein the substrate holder is joined tightly to the covering unit and a plurality of passage holes are arranged circumferentially on a circumferential wall of the substrate holder so that an internal coating space, defined by the covering unit and the substrate holder, is in fluid communication with an environment outside the internal coating space via the passage holes;
wherein the internal coating space is further defined by an inclined internal surface of the circumferential wall of the substrate holder; and
wherein a shell-like internal wall surface of the attachment is curved in an arc at a predetermined angle so that a distance between the curved internal surface of the attachment and an outer surface of the circumferential wall of the substrate holder, proximate outlets of the passage holes, is in a range of 20-30 mm so as to increase a Venturi effect in the passage holes to provide an increased extraction effect.

2. The device as claimed in claim 1, wherein sealing means are provided between the covering unit and the substrate holder.

3. The device as claimed in claim 1, wherein the shell-like internal wall surface of the attachment is spaced a distance from the circumferentially arranged passage holes of the substrate holder so that during the spin-coating operation, the passage holes of the substrate holder execute a movement relative to the shell-like internal wall surface of the attachment.

4. The device as claimed in claim 3, wherein at least one of the passage holes of the substrate holder and the shell-like internal wall surface of the attachment are configured so that a predefined negative pressure is produced in the passage holes and in the internal coating space during the relative movement of the substrate holder.

* * * * *